(12) United States Patent
Lee et al.

(10) Patent No.: US 8,174,279 B2
(45) Date of Patent: May 8, 2012

(54) SOCKET CONNECTOR FOR CONNECTION LEAD OF SEMICONDUCTOR DEVICE UNDER TEST WITH TESTER

(75) Inventors: Kok Hua Lee, Shah Alam (MY); Zi Yi Lam, Kuala Lumpur (MY); Wai Khuin Phoon, Petaling Jaya (MY)

(73) Assignee: Freescale Semiconductor, Inc., Austin, TX (US)

( * ) Notice: Subject to any disclaimer, the term of this patent is extended or adjusted under 35 U.S.C. 154(b) by 376 days.

(21) Appl. No.: 12/545,074

(22) Filed: Aug. 21, 2009

(65) Prior Publication Data
US 2011/0043234 A1 Feb. 24, 2011

(51) Int. Cl.
*G01R 31/00* (2006.01)
*G01R 31/20* (2006.01)
*G01R 1/067* (2006.01)
(52) U.S. Cl. .......... 324/756.02; 324/754.16; 324/755.09
(58) Field of Classification Search ............ 324/756.01–756.04, 762.01–762.1, 324/754.01–754.3; 257/48; 439/5, 199
See application file for complete search history.

(56) References Cited

U.S. PATENT DOCUMENTS

| | | | |
|---|---|---|---|
| 3,895,197 A * | 7/1975 | Mizrahi | ............ 200/61.47 |
| 5,247,108 A | 9/1993 | Hirai et al. | |
| 5,779,492 A | 7/1998 | Okuyama et al. | |
| 6,118,285 A | 9/2000 | Parker et al. | |
| 6,373,716 B1 | 4/2002 | Muramatsu | |
| 6,710,440 B2 | 3/2004 | Kanaparthy et al. | |
| 7,147,478 B1 | 12/2006 | Ju | |
| 7,202,679 B2 * | 4/2007 | Maruyama et al. | ...... 324/754.16 |
| 2006/0139040 A1 | 6/2006 | Nystrom et al. | |

* cited by examiner

*Primary Examiner* — Jermele M Hollington
*Assistant Examiner* — Tung X. Nguyen
(74) *Attorney, Agent, or Firm* — Charles Bergere

(57) ABSTRACT

A socket connector for electrically connecting a lead of a semiconductor device under test (DUT) with a tester includes a container having a chamber, a conductive end or plug that seals the chamber at one end, and a conductive membrane that seals the chamber at another end. A liquid conductive material fills the chamber. The conductive plug is arranged to be in electrical contact with the tester. The lead of the semiconductor DUT is in electrical contact with the conductive membrane and thus with the tester via the conductive membrane, the liquid conductive material and the conductive plug.

19 Claims, 4 Drawing Sheets

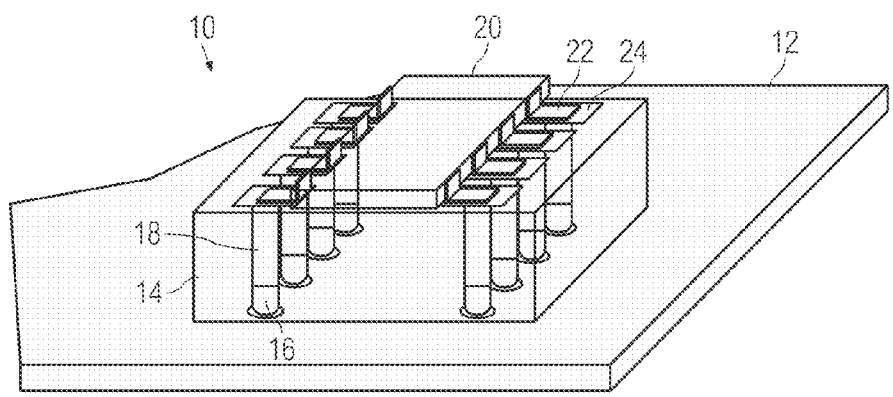
*FIG. 1*
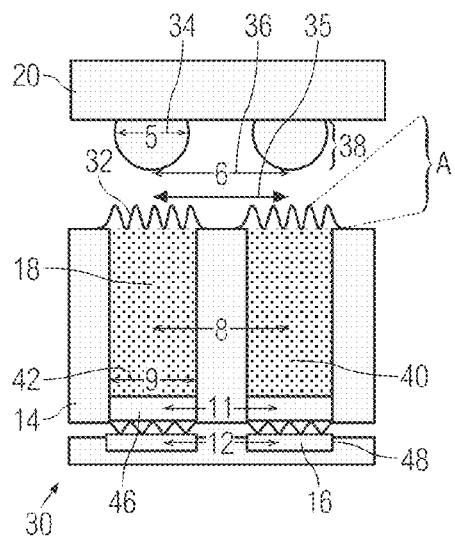
*FIG. 2A*
*FIG. 2B*
*FIG. 2C*

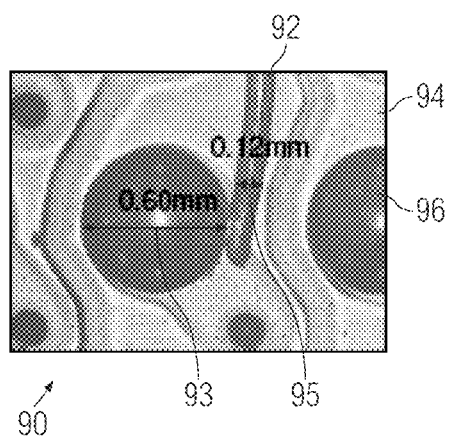 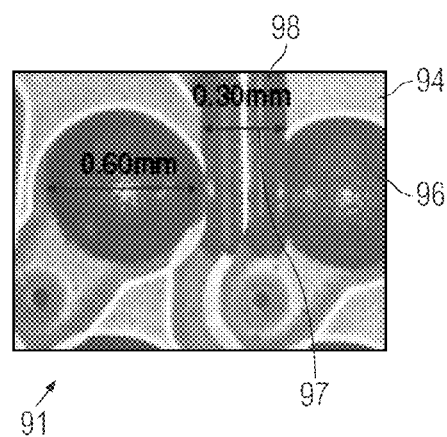
*FIG. 5A*   *FIG. 5B*

US 8,174,279 B2

SOCKET CONNECTOR FOR CONNECTION LEAD OF SEMICONDUCTOR DEVICE UNDER TEST WITH TESTER

BACKGROUND OF THE INVENTION

The present invention relates generally to a method and apparatus for providing electrical contact between a semiconductor device under test (DUT) and a tester system during semiconductor device testing, and more particularly to a method and apparatus for electrically contacting a DUT to a tester system in a final test process.

After packaging, semiconductor devices undergo quality and performance checks and tests. The semiconductor device or semiconductor device under test (DUT) requires an electrical connection with a current source of a tester for performing the electrical conductivity, performance and connectivity tests. Systems and devices have been devised for placement and positioning of electrical and mechanical probes on desired test points of the DUT. Conventional designs often result in damage to the semiconductor leads of the DUT during testing. For example visual mechanical (VM) defects such as indentation marks, burr marks, bent leads and the like obtained during testing from conventional test devices may make an otherwise finished and faultless semiconductor device defective.

In some conventional designs contacting probes such as pogo pins having sharp tips are used. Sometimes the sharp pogo tips are off center such that the tip of the pogo pin does not contact the center top surface of the lead of the semiconductor DUT as intended. Defects such as burrs are incurred on the leads or balls of the semiconductor DUT, which may contribute to lead defects. This problem is amplified when the DUT is packaged with multiple leads having fine pitch and narrow lead width. In such devices the risk of misalignment of the sharp contacting probe tips with the lead of the DUT is high. Additionally, compression forces of the probe on the DUT may result in substrate cracks, package cracks, lead defects, ball defects and the like when the probe contacts the DUT. As a result, such conventional test devices and systems can contribute to semiconductor yield losses. Even if the semiconductor device meets test standards, the life span of the device and the pogo pins may be shortened as a result of the testing process.

Attempts have been made to design systems without sharp contacting probes and have incorporated liquid metal configurations. However, such conventional designs can contaminate the semiconductor DUT and may prevent additional processing of the semiconductor such as solder after test. Also, such systems are not suitable in batch test configurations or frequent connect/disconnect of the semiconductor DUT with the tester applications. Even in these designs and systems, there may still be high compression forces generated that contribute to semiconductor yield losses.

Therefore, there is a need for a method for electrically connecting and an electrical connection between a semiconductor DUT and a tester that overcomes or at least alleviates the problems associated with conventional connections between semiconductor DUTs and testers during final testing of semiconductor devices.

BRIEF DESCRIPTION OF THE DRAWINGS

The invention, together with objects and advantages thereof, may best be understood by reference to the following description of the presently preferred embodiments together with the accompanying drawings. In the drawings, like numerals are used for like elements throughout.

FIG. 1 illustrates a perspective view of a connector device between a semiconductor device under test and a tester in accordance with an embodiment of the invention;

FIGS. 2A-2C show the contact material between a semiconductor device under test and a tester (FIG. 2A), the conductive membrane in more detail in cross-section view (FIG. 2B), and the conductive membrane in more detail in perspective view (FIG. 2C), in accordance with an embodiment of the invention;

FIGS. 5A and 5B illustrate the size of the conductive particles graphically in accordance with an embodiment of the invention;

DETAILED DESCRIPTION OF THE INVENTION

Figure 3A:
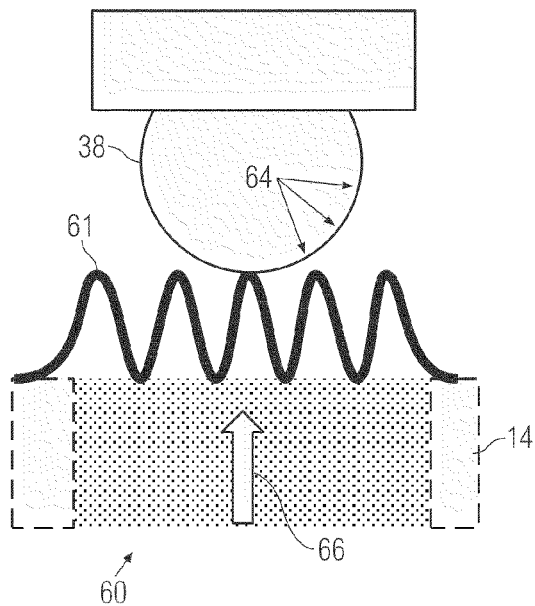
FIGS. 3A-3B show the interaction of the conductive membrane with the DUT in a relaxed state and a stressed state respectively of FIGS. 2A-2C in more detail in accordance with an embodiment of the invention.

An aspect of the invention is a socket connector for electrically connecting a lead of a semiconductor device under test (DUT) with a tester, the socket connector comprising a container having a chamber; a conductive plug sealing the chamber at one end to form the container; a conductive membrane sealing the chamber of the container at another end; a liquid conductive material filled inside the chamber of the container, the conductive plug is arranged to be in electrical contact with the tester and the lead of the semiconductor DUT electrically in contact with the conductive membrane, the lead of the semiconductor DUT electrically in contact with the tester via the conductive membrane, liquid conductive material and the conductive plug.

In an embodiment of the socket connector, the conductive membrane may have a layer of polymer; and a conductive particle secured in the layer of polymer, the conductive particle having an edge exposed on one side of the polymer membrane to contact a surface of the semiconductor DUT, and the conductive particle having an edge exposed on another side the polymer membrane to contact a liquid conductive material.

In an embodiment if the invention, the material of the conductive particle may be Molybdenum, Graphite, Palladium, Silver, Tungsten, Gold, Copper, or the like. The conductive particle may be cylinder shaped with sharp edges for enhance conductivity by scraping of any oxidation layer present on the lead of the semiconductor DUT. The hardness of the material of the conductive materials may be harder than the hardness of the material of the lead of the semiconductor DUT. The conductive membrane may comprise a plurality of conductive particles. The conductive particles may be all of uniform or non-uniform height and dimensions. The conductive particles may be of different height and dimensions. The conductive particles may be all spaced uniformly apart uniformly or non-uniformly. The height of each particle may be more than the distance with the adjacent particle to prevent collision between the adjacent particles in the conductive membrane.

In an embodiment of the invention, the conductive membrane may be a polymer and the polymer is rubber or silicon. The conductive membrane may be folded in a relaxed state, and may unfold in a stressed state when a pressure load force is exerted from the lead of the semiconductor DUT. The diameter of the conductive membrane may be greater than the diameter of the corresponding lead of the semiconductor DUT.

In an embodiment of the invention, the conductive end may be a conductive plug sealing the chamber at one end to form the container, and the diameter of the conductive end may be greater than the diameter of a corresponding conducting pad of a load board of the tester. The conducting end may have a sharp edge configuration to enhance conductivity with a conducting pad of a load board of the tester.

In an embodiment of the invention, the liquid conductor may be a metal or an alloy that is in liquid form at ambient room temperature, such as Gallium, Indium, or Tin.

In an embodiment of the invention, the conductive membrane has a layer of polymer; and a conductive particle secured in the layer of polymer, the conductive particle having an edge exposed on one side of the polymer membrane to contact a surface of the semiconductor DUT, and the conductive particle having an edge exposed on another side the polymer membrane to contact a liquid conductive material. The thickness of the conductive membrane may be 0.2 mm or less, and the conductive particles may have a dimension of 0.1 mm or less.

An aspect of the invention is a conductive membrane for a socket connector in electrically connecting a lead of a semiconductor device under test (DUT) with a tester, the conductive membrane comprising a layer of polymer; and a conductive particle secured in the layer of polymer, the conductive particle having an edge exposed on one side of the polymer membrane to contact a surface of the semiconductor DUT, and the conductive particle having an edge exposed on another side the polymer membrane to contact a liquid conductive material.

Another aspect of the invention is a method of fabricating a socket connector for electrically connecting a semiconductor device under test (DUT) with a tester, the method comprising providing a container having a chamber; plugging an end of a chamber with a conductive plug to define a container; filling the chamber of the container with a liquid conductive material; and sealing another end of the chamber of the container with a conductive membrane; the conductive plug in electrically in contact with the tester and the lead of the semiconductor DUT electrically in contact with the conductive membrane, the lead of the semiconductor DUT electrically in contact with the tester via the conductive membrane, liquid conductive material and the conductive plug.

A further aspect of the invention is a method of testing a semiconductor device under test (DUT) with a tester. The method includes providing socket connector for electrically connecting a lead of the semiconductor device under test (DUT) with the tester, the socket connector comprising a container having a chamber; a conductive plug sealing the chamber at one end to form the container; a conductive membrane sealing the chamber of the container at another end; a liquid conductive material filled inside the chamber of the container, the conductive plug in electrically in contact with the tester and the lead of the semiconductor DUT electrically in contact with the conductive membrane, the lead of the semiconductor DUT electrically in contact with the tester via the conductive membrane, liquid conductive material and the conductive plug.

With reference now to FIG. 1, a perspective view of a connector device system 10 is shown between a semiconductor device under test (DUT) 20 and a load board 12 that is loaded in a tester in accordance with an embodiment of the invention. The tester may be any tester for testing a DUT, for example FLEX from Teradyne Inc. of Massachusetts, United States of America, T2000 from Advantest Corporation of Tokyo, Japan, Pinscale from Agilent Technologies, Inc. of California, United States of America, and the like. FLEX is a registered trademark of Teradyne, Inc. The part of a tester that is shown in FIG. 1 is shown as a load board 12. The DUT has leads 22, ball grid arrays or the like that are arranged and placed on corresponding DUT connectors 24 of a connector device or socket 14. The connector device or socket 14 is formed of socket connectors 18 that are filled with contact material such as a liquid conductor or metal as the conductor between the DUT connector point of contact 24 and the tester point of contact 16.

FIG. 2A shows the contact material and configuration of the socket connector 18 of the connector device 14 between the semiconductor device under test (DUT) 20 and the load board 12 of a tester in accordance with an embodiment 30 of the invention. The connector device 14 is formed of a non-conductive material such as SEMITRON, TORLON and the like. SEMITRON is a registered trademark of Quadrant of Pennsylvania, United States of America. TORLON is a registered trademark of Solvay Advanced Polymers, LLC of Georgia, United States of America. In the socket or connector device 14, socket connectors 18 are formed. The socket connectors 18 are containers or chambers formed by the walls of the socket 14 material, the tester point of contact 16 and the DUT point of contact 24.

The DUT connector or point of contact 24 with the socket comprises a conductive membrane 32. The tester connector comprises a conducting end or plug 46. The conducting plug 46 may have a sharp edge conducting plug configuration as shown or have other configurations so long as electrical contact is made between the conducting plug and the tester point of contact 16, i.e., conducting pads 48. The conducting plug 46 is in contact with conducting pads 48 of the load board 12 as shown. The material of the conductive plug 46 may be the same or different as the conductive particles in the conductive membrane 32.

The socket 14 has the socket connector or liquid metal container 18 that is filled with a liquid conductor or metal 40. Such liquid conductors may be for example an alloy of gallium (GA), indium (In), tin (Sn) and the like, which are in a liquid form at ambient room temperature, such as for example 20° C. The diameter 42 of the liquid metal containers or socket connectors 18 extends across the length of the connector of the load board conducting pad 16, and extends beyond the diameter of the lead or ball grid array diameter 34. The sockets have a pitch 35 that is the same as a pitch 36 of the leads 22. However to ensure that the leads of the DUT contact the conductive membrane 32, the diameter of the conductive membrane is greater than the diameter of the corresponding lead or ball grid array.

The conductive membrane 32 is shown in more detail in FIG. 2B in accordance with an embodiment 50 of the invention. The conductive membrane 32 comprises a plurality of conducting particles 44 arranged uniformly in the polymer 45 material of the conductive membrane.

The conducting particles 44 may be arranged in a uniform pattern, such as aligned with each other, or in a random fashion. The particles 44 may be of a conductive material such as for example copper, silver, gold, tungsten and the like. The conductive particles 44 may have a cylindrical shape with sharp ends, where the top end contacts the DUT while the other, bottom end is exposed to the liquid conductor material. The conductive particles 44 are held and fixed in place with respect to the conductive membrane 32 by the material of the membrane.

The polymer of the conductive membrane may be a material such as rubber, silicon and the like that have insulative and elasticity characteristics. The material of the conductive membrane and the conductive plug is impermeable to the liquid conductive material. The choice of material may differ depending on the specific application. For example, while some materials such as rubber are a more appropriate material for applications at room temperature, other materials such as silicon can withstand larger temperature ranges of for example −40° C. to 150° C. Conductive particles are deposited in the membrane with areas of the conductive particles exposed on either side of the conductive membrane 32. For example, for conductive particles having a cylinder shape, both ends of the conductive particles protrude from the conductive membrane 32 such that one end is exposed to the conductive material, and the other end is exposed to contact the point of contact with the DUT leads. The conductive membrane 32 folds like a ripple when seen in a cross-section view as shown in FIG. 2B. From a perspective view of FIG. 2C the wave form of the conductive membrane of one embodiment 52 is shown. It will be appreciated that the conductive membrane may take other forms having cross-sections such as straight, other wave forms, such as peaked, non-uniform and the like. The conductive membrane may fold during the stressed state 65 shown in FIG. 3B from the relaxed state 60 shown in FIG. 3A such that the conductive membrane folds like a ripple when seen in cross-section view when in relaxed or non-compressed state. When in a compressed or stressed state, the conductive membrane stretches due to the conductive membrane's elasticity nature and hence increases the surface contact area of the conductive membrane.

Figure 3B:
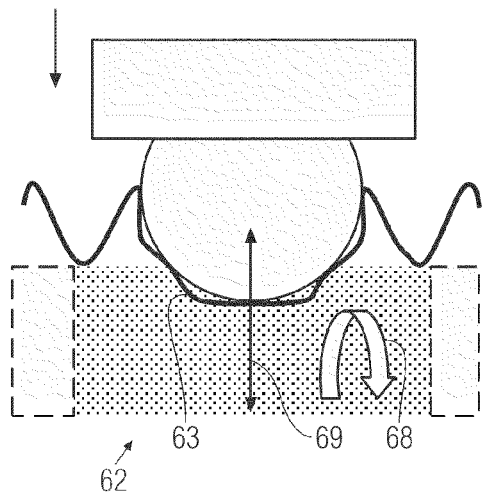

FIGS. 3A-3B show the interaction of the conductive membrane 32 with the lead/BGA of the DUT of FIG. 1 and FIG. 2A in more detail in accordance with an embodiment of the invention. FIG. 3A shows a relaxed state 60 and FIG. 3B shows a stressed state 65 of the conductive membrane 32. The solder ball 38 of the DUT with BGA packaging is shown having a surface area enclosure 64 that is to come into contact with the conductive membrane 32. When the BGA of the DUT is lowered in the direction of the arrow 62 and comes into contact with the conductive membrane a pressure load force from the BGA is exerted onto the conductive membrane 32. The relaxed conductive membrane 61 is the conductive membrane in its relaxed state. The conductive membrane 63 shows the conductive membrane in the response to the load force from the BGA, however, the outline of the BGA in contact with the stressed conductive membrane 61 in its stressed state is shown in FIG. 3B. The detail of the BGA in contact with the stressed conductive membrane 63 is shown and discussed in more detail below with reference to FIG. 4A-4B. The arrow 66 in FIG. 3A shows the load force absorption and the arrow 68 in FIG. 3B shows that overflow is prevented. Arrow 69 of FIG. 3B shows that conductivity is provided between the BGA, conductive material and the liquid metal. For example, there may be a low resistance of for example ~43.5 μΩ. The pressure resulting from the load force of the BGA acting on the conductive material and the liquid metal may be a pressure such as for example <200 g/mm².

Figure 4A:
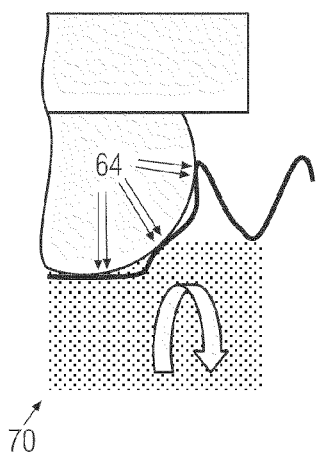
FIGS. 4A-4B show a ball grid array/lead of FIG. 3 in more detail having effective conducting surface (FIG. 4A) and detailed interaction with an oxidation layer (FIG. 4B), in accordance with an embodiment of the invention.
Figure 4B:
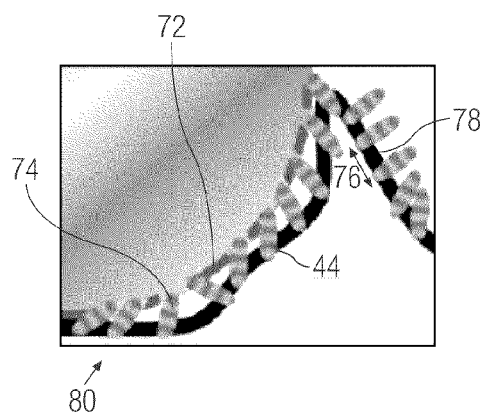

FIG. 4A shows a ball grid array (BGA)/lead of FIG. 3 in more detail having effective conducting surface 64 in contact with and exerting a load force on to the conductive membrane. A more detailed view of the interaction with oxidation layer in accordance with an embodiment of the invention is shown in FIG. 4B. An oxidation layer 72 may be formed over the area of the BGA/leads. The membrane comprises micro cylinder shaped conducting particles having sharp edges 44. The conducting particles may be spaced apart by distance 76, and have a height 78 as shown by respective arrows. It will be appreciated that the conducting particles may all have uniform height and/or spacing, and/or different height and/or spacing. A conductive material is used that may be high corrosion resistance material such as for example molybdenum, graphite, palladium and the like. As shown at sharp edge 74 that contacts BGA effective conducting surface 64, a scrapping action is created between the sharp edge of the conducting particles to enhance conductivity by scraping off any oxidation layer 72. The scraping action may be performed by selecting a material of the conducting particles 44 which is harder than the ball/leads of the DUT. Examples of materials and respective material hardness are:

| Vickers Hardness, HV: | kgf/mm² |
|---|---|
| Tungsten: | 349 |
| 100LQFPPb Free: | 170 |
| 100LQFPPb Plating: | 165 |
| 144LQFPPb Free: | 163 |
| Copper: | 37 |
| Gold: | 22 |

The conductive particles may be manufactured and arranged in the polymer of the conductive membrane in a way that the height of each particle is more than the distance with the adjacent particle. This arrangement ensures that the conductive particles are less likely to collide with the adjacent particles in the polymer and ensures reliability of the elastic membrane. It will be appreciated that the conductive particles may take any other shape and have different spacings. The actual shape and the spacing of the conductive particles that are selected and designed may be specific for each application.

FIG. 5A and FIG. 5B show size illustration 90, 91 of the conductive particles graphically in accordance with an embodiment of the invention. A wire 92 having a width 95 of 0.12 mm is shown next to a BGA 96 of 0.60 mm width 93 in FIG. 5A, and a wire 98 having a width 97 of 0.30 mm is shown next to a BGA 96 of 0.60 mm width 93 in FIG. 5B. The size of the conductive particles in the conductive membrane may be on the scale of for example a diameter of 0.1 mm or less, and the thickness of the polymer of the membrane may be for example 0.2 mm or less. The length of the particle must be greater than the thickness of the membrane to allow the particle to be exposed on either side of the membrane, for example by at least 5%. The conductive membrane is attached or fixed to the connector device to seal the chamber of the container by a variety of means, for example with an adhesive compound that fixes the membrane to the connector device. An example of applying the conductive membrane to the connector device is to first put a mask on the socket. The mask only exposes the area where the adhesive needs to be deposited. Once the adhesive is applied, the mask may be removed and the conductive membrane may be aligned for completing the attaching process. Other methods can be envisaged. It will be appreciated that the membrane itself may or may not be conductive, however, the membrane becomes conductive due to the placement and orientation of the conductive particles.

Figure 6:
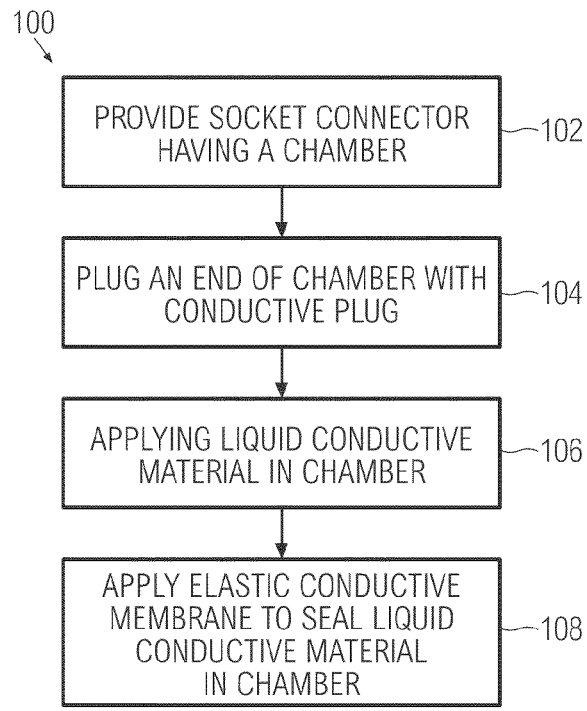
FIG. 6 is a flow chart of a method of fabricating a connector between a tester and a semiconductor device under test (DUT) in accordance with an embodiment of the invention.

FIG. 6 is a flow chart 100 of a method of fabricating a connector between a tester and a DUT in accordance with an embodiment of the invention. A socket connector of a non-conductive material is provided 102 with a chamber for receiving a liquid conductor material. An end of the socket connector chamber is plugged 104 with a conductive plug to form a connector with the tester. A liquid conductor material is applied 106 to the socket connector chamber to fill the chamber. An elastic conductive membrane is applied 108 to another end of the socket connector chamber to seal in the liquid conductor material. Of course it will be appreciated that the order of applying the elastic conductive membrane and the conductive plug may be in any order with respect to applying the liquid conductor material. For example, the elastic conductive membrane may be applied to one end of the socket connector then the liquid conductor material may be applied, followed by the application of the conductive plug.

Figure 7:
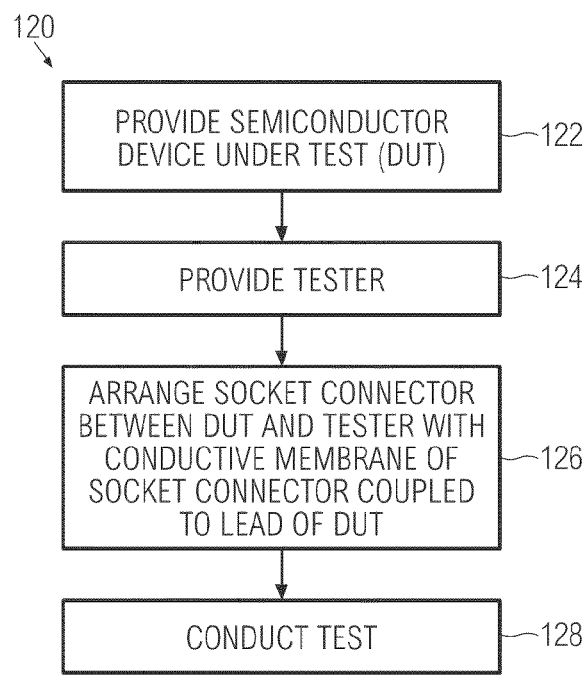
FIG. 7 is a flow chart of a method of testing a semiconductor device under test (DUT) in accordance with an embodiment of the invention.

FIG. 7 is a flow chart 120 of a method of testing a semiconductor device under test with a tester. A first step 122 is providing a semiconductor device under test (DUT) and then step 124 of providing a tester. At step 126, a socket connector is arranged between the tester and the DUT. The socket connector has a conductive membrane that is arranged to contact the leads of the DUT, and electrically coupled to the tester via the conductive membrane liquid conductive material and a conductive connector with the tester.

The liquid conductive material of the socket is applied as metal in liquid form as the contact material between DUT-to-tester. The liquid conductive material may be conductive materials such as for example an alloy of Ga, In, and Sn at room temperature. The liquid metal that is applied also does not adhere to the lead/pin or leave residues when DUT is removed. The liquid metal is held/contained in customized socket with elastic conductive membrane at the top, and conductive plug at the bottom.

The elastic conductive membrane (top layer) serves as a conducting point to the package ball or leads. In the elastic conductive membrane, the micro-conducting particles are supported in a layer or housing of synthetic elastic polymer. The polymer layer or housing also serves to electrically insulate the adjacent micro-conducting particles. Due to the elasticity of membrane, the membrane envelopes the balls or leads by applying near zero insertion force (ZIF) or low insertion force (LIF). The enveloping action provides a larger effective contact surface as compared to conventional methods of conducting such as pogo pin methods and the like.

The liquid metal within will establish electrical connection between ball/leads of the DUT and load board, for example the tester. The liquid metal absorbs the load force from the package ball or leads. The plugs underneath will contact with the pads on the load board.

With the configuration of embodiments of the invention, vm defects such as indentation marks, burr, bend leads on package leads or balls are minimized. The liquid form of contacts does not require compression force (near zero insertion), while conductive polymer envelopes the semiconductor leads and provide a good surface of electrical contact as compared to other conventional means such as pogo pins and the like. As the compression force is kept minimized to near zero compression, risk of substrate and package crack is minimized. This results in minimizing yield losses due to such damage resulting during conventional semiconductor testing processes. Also, embodiments of the invention do not require mechanical means such as springs for activation of the conductive socket, wear and tear of the socket connector is minimized. Additionally, embodiments of the invention are suitable in batch test configurations or frequent connect/disconnect of the semiconductor DUT with the tester applications.

While embodiments of the invention have been described and illustrated, it will be understood by those skilled in the technology concerned that many variations or modifications in details of design or construction may be made without departing from the present invention.

The invention claimed is:

1. A socket connector for electrically connecting a lead of a semiconductor device under test (DUT) with a tester, the socket connector comprising:
    a container having a chamber;
    a conductive end forming one end of the container, wherein the conductive end is in electrical contact with the tester and wherein the conductive end comprises a conductive plug that seals the chamber at one end;
    a conductive membrane sealing the chamber at another end of the container, wherein the lead of the semiconductor DUT is electrically in contact with the conductive membrane; and
    a liquid conductive material that fills the chamber, wherein the lead of the semiconductor DUT is electrically in contact with the tester via the conductive membrane, the liquid conductive material, and the conductive end.

2. The socket connector of claim 1, wherein the conductive membrane further comprises:
    a layer of polymer; and
    a conductive particle secured in the polymer layer, the conductive particle having a first edge exposed on one side of the polymer layer, the first edge contacting a surface of the semiconductor DUT, and the conductive particle having a second edge exposed on another side the polymer layer for contact with the liquid conductive material.

3. The socket connector of claim 2, wherein the conductive particle is cylinder shaped and has sharp edges that scrape an oxidation layer present on the lead of the semiconductor DUT.

4. The socket connector of claim 3, wherein the conductive particle is harder than a hardness of the lead of the semiconductor DUT.

5. The socket connector of claim 3, wherein the conductive particle comprises one of Molybdenum, Graphite, Palladium, Silver, Tungsten, Gold, and Copper.

6. The socket connector of claim 2, wherein the conductive membrane comprises a plurality of conductive particles.

7. The socket connector of claim 6, wherein a height of each particle is greater than a distance to an adjacent particle to prevent collision between adjacent particles in the conductive membrane.

8. The socket connector of claim 2, wherein the conductive particles have a dimension of 0.1 mm or less.

9. The socket connector of claim 1, wherein the conductive membrane is folded in a relaxed state, and unfolded in a stressed state when a pressure load force is exerted from the lead of the semiconductor DUT.

10. The socket connector of claim 1, wherein a diameter of the conductive membrane is greater than a diameter of a lead of the semiconductor DUT.

11. The socket connector of claim 1, wherein a diameter of the conductive end is greater than a diameter of a corresponding conducting pad of a load board of the tester.

12. The socket connector of claim 1, wherein the conductive end has a sharp edge configuration.

13. The socket connector of claim 1, wherein the liquid conductor is a metal or an alloy that is in liquid form at ambient room temperature.

14. The socket connector of claim 1, where the conductive membrane is fixed to the container.

15. The socket connector of claim 1, wherein a thickness of the conductive membrane is 0.2 mm or less.

16. A socket connector for electrically connecting a lead of a semiconductor device under test (DUT) with a tester, the socket connector comprising:
 a container having a chamber;
 a conductive end forming one end of the container, wherein the conductive end is in electrical contact with the tester;
 a conductive membrane sealing the chamber at another end of the container, wherein the lead of the semiconductor DUT is electrically in contact with the conductive membrane; and
 a liquid conductive material that fills the chamber, wherein the lead of the semiconductor DUT is electrically in contact with the tester via the conductive membrane, the liquid conductive material, and the conductive end, and wherein the conductive membrane further comprises:
  a layer of polymer; and
  a conductive particle secured in the polymer layer, the conductive particle having a first edge exposed on one side of the polymer layer, the first edge contacting a surface of the semiconductor DUT, and a second edge exposed on another side the polymer layer for contact with the liquid conductive material.

17. A conductive membrane for a socket connector that electrically connects a lead of a semiconductor device under test (DUT) with a tester, the conductive membrane comprising:
 a layer of polymer; and
 a conductive particle secured in the polymer layer, the conductive particle having a first edge exposed on one side of the polymer membrane to contact a surface of the semiconductor DUT, and a second edge exposed on another side the polymer membrane to contact a liquid conductive material.

18. The conductive membrane of claim 17, wherein the conductive particle is cylinder shaped with sharp edges, wherein the sharp edges scrape an oxidation layer present on the lead of the semiconductor DUT.

19. The conductive membrane of claim 18, wherein the conductive membrane comprises a plurality of conductive particles.

* * * * *